United States Patent
Jun et al.

(10) Patent No.: US 7,621,997 B2
(45) Date of Patent: Nov. 24, 2009

(54) METHODS OF PREPARING A MULTI-SHELL NANOCRYSTAL STRUCTURE, MULTI-SHELL NANOCRYSTAL STRUCTURES AND FABRICATED DEVICE INCLUDING THE SAME

(75) Inventors: Shin Ae Jun, Seongnam-Si (KR); Eun Joo Jang, Daejeon-Si (KR)

(73) Assignee: Samsung Electro-Mechanics Co., Ltd., Gyeonggi-do (KR)

( * ) Notice: Subject to any disclaimer, the term of this patent is extended or adjusted under 35 U.S.C. 154(b) by 204 days.

(21) Appl. No.: 11/446,275

(22) Filed: Jun. 5, 2006

(65) Prior Publication Data
US 2007/0059527 A1    Mar. 15, 2007

(30) Foreign Application Priority Data
Sep. 12, 2005   (KR)   .................. 10-2005-0084554

(51) Int. Cl.
*C30B 29/62* (2006.01)
(52) U.S. Cl. .............. 117/68; 117/69; 117/73; 117/74; 977/712; 977/714
(58) Field of Classification Search ........... 117/68, 117/69, 73, 74; 977/712, 724
See application file for complete search history.

(56) References Cited

U.S. PATENT DOCUMENTS

| | | | |
|---|---|---|---|
| 6,207,229 B1 | 3/2001 | Bawendi et al. | |
| 6,225,198 B1 | 5/2001 | Alivisatos et al. | |
| 6,306,736 B1 | 10/2001 | Alivisatos et al. | |
| 6,322,901 B1 | 11/2001 | Bawendi et al. | |
| 2004/0110002 A1 | 6/2004 | Kim et al. | |
| 2005/0129947 A1 | 6/2005 | Peng et al. | |
| 2007/0049765 A1* | 3/2007 | Lucey et al. | 556/1 |
| 2007/0116868 A1* | 5/2007 | Weiss et al. | 427/212 |

FOREIGN PATENT DOCUMENTS

WO   WO 2005/031802   4/2005

OTHER PUBLICATIONS

European Search Report dated Jun. 5, 2009 in corresponding European Application No. 06254428.3.
Jun et al., "Synthesis of multi-shell nanocrystals by a single step coating process", Nanotechnology 17, pp. 3892-3896 (2006).
Xie et al., "Synthesis and Characterization of Highly Luminescent CdSe-Core CdS/ZN0.5Cd0.5S/ZnS Multishell Nanocrystals", J. Am. Chem. Soc., v. 127, No. 20, pp. 7480-7488 (2005).

* cited by examiner

*Primary Examiner*—Robert M Kunemund
(74) *Attorney, Agent, or Firm*—Harness, Dickey & Pierce, P.L.C.

(57) ABSTRACT

Methods of preparing a multi-shell nanocrystal structure, multi-shell nanocrystal structures thus obtained, and a fabricated device including the same are provided. A multi-shell nanocrystal structure may be formed by preparing a core nanocrystal and reacting the core nanocrystal with two or more precursors having different reaction rates to sequentially form two or more layers of shell nanocrystals having different compositions on a surface of the core nanocrystal.

27 Claims, 7 Drawing Sheets

| CdSe | CdSe/ | CdSe/ | CdSe/ |
| core | CdS | CdS/ZnS | CdS·ZnS |

Luminescence efficiency (QY)    30%    71%

METHODS OF PREPARING A MULTI-SHELL NANOCRYSTAL STRUCTURE, MULTI-SHELL NANOCRYSTAL STRUCTURES AND FABRICATED DEVICE INCLUDING THE SAME

PRIORITY STATEMENT

This non-provisional application claims the benefit of priority under 35 U.S.C. § 119 from Korean Patent Application No. 2005-84554, filed on Sep. 12, 2005, in the Korean Intellectual Property Office (KIPO), the disclosure of which is herein by reference in its entirety.

BACKGROUND OF THE INVENTION

1. Field of the Invention

Example embodiments of the present invention relate to methods for forming a multi-shell nanocrystal structure, multi-shell nanocrystal structures and a method for fabricating a device including the same. Other example embodiments of the present invention relate to methods for forming a multi-shell nanocrystal structure by preparing a core nanocrystal and simultaneously using at least two precursors having different reaction rates to sequentially form at least two shell layers of nanocrystals having different compositions on a surface of the core nanocrystal, multi-shell nanocrystal structures and fabricated device including the same.

2. Description of the Related Art

A nanocrystal designates a material of a nanometer-sized crystal composed of several hundreds to several thousand atoms. A nanocrystal exhibit electrical, magnetic, optical, chemical and mechanical properties different from those inherent properties of the materials itself. The properties of nanocrystals could be variously adjusted by controlling the physical size of nanocrystals.

Vapor deposition processes, (e.g., metal organic chemical vapor deposition (MOCVD) and molecular beam epitaxy (MBE)) has been generally used to prepare nanocrystals. A wet chemistry technique, wherein a precursor material may be added to an organic solvent to grow a nanocrystal, has been rapidly developed recently. In the wet chemistry technique, a surfactant is coordinated on the surface of the nanocrystal to control the crystal growth during reaction. Therefore, the wet chemistry technique could provide nanocrystals of more uniform size and shape with a lower cost, compared to other conventional vapor deposition processes (e.g., MOCVD, MBE, etc.).

Conventional processes (U.S. Pat. Nos. 6,225,198 and 6,306,736) provide a technique for forming nanocrystals by adding a Group II-VI or Group III-V precursor in a surfactant and a solvent at crystal growth temperature.

The conventional art (U.S. Pat. Nos. 6,322,901 and 6,207,229) discloses a core-shell nanocrystal of a type I structure and a method for preparing the nanocrystal, exhibiting enhanced quantum efficiency about 30-50% with maintaining the emission wavelength of a core nanocrystal.

The core-shell nanocrystal structure is generally prepared by preparing and separating a core and introducing the separated core into a reaction mixture to grow shell on surface of core.

In the above-mentioned conventional techniques, the optical property of nanocrystal emitting pure-wavelength light with high efficiency, which induces by the electron-hole recombination only at an edge of an energy band gap, may be applied to displays or to bio image sensors.

In addition, the conventional art (U.S. Patent Publication No. 2004/011002) discloses a method for preparing core-shell nanocrystal structure having a type II structure. In the conventional nanocrystal structure of type II, which has higher conduction and valence bands of a core than a shell layer or lower conduction and valence bands of a core than a shell layer, excited electrons and holes are dispersed and confined in the core and the shell layer, respectively. Therefore, the emission wavelength of the type II nanocrystal structure may be shifted to a longer wavelength with decrease of the quantum efficiency.

SUMMARY OF THE INVENTION

Example embodiments of the present invention relate to methods for forming a multi-shell nanocrystal structure, multi-shell nanocrystal structures and a method for fabricating a device including the same. Other example embodiments of the present invention relate to methods for forming a multi-shell nanocrystal structure by preparing a core nanocrystal and simultaneously using at least two precursors having different reaction rates to sequentially form at least two shell layers of nanocrystals having different compositions on a surface of the core nanocrystal, multi-shell nanocrystal structures and a method for fabricating a device including the same.

In yet other example embodiments of the present invention methods for forming a multi-shell nanocrystal structure with higher reproducibility prepared using a more efficient technique while decreasing production time (e.g., reducing the process for separation between forming shell layers).

According to example embodiments of the present invention, methods for forming a multi-shell nanocrystal structure may include forming a core nanocrystal, and simultaneously reacting at least two precursors having different reaction rates to sequentially form at least two shell layers of nanocrystals having different compositions on a surface of the core nanocrystal.

According to example embodiments of the present invention, a multi-shell nanocrystal structure may be formed by adding a solution including core nanocrystals into a reaction mixture including a solvent, at least two metal precursors with different reaction rates and/or a Group V or VI precursor (e.g., a precursor having a Group V or VI element). Alternatively, a solution of the core nanocrystals may be simultaneously reacted with a mixture of a solvent, a metal precursor and/or at least two Group V or VI precursors with different reaction rates.

Example embodiments of the present invention also provide multi-shell nanocrystal structures prepared by the method described above. The multi-shell nanocrystal structure may include a core nanocrystal and at least two shell layers of nanocrystals having different compositions on a surface of the core nanocrystal.

In other example embodiments of the present invention, the shell layers of nanocrystals may include a plurality of shell layers l of nanocrystals having a plurality of inner shell layers $l_m$ and a plurality of outer shell layers $l_{n-m}$.

In other example embodiments of the present invention, the shell layers of nanocrystals may be selected from nanocrystal layers capable of shifting an emission wavelength to a longer wavelength. Alternatively, the shell layers nanocrystals may be selected from nanocrystal layers capable of increasing luminescence efficiency.

Example embodiments of the present invention also provide a fabricated device that include a multi-shell nanocrystal structure. After the multi-shell nanocrystal was mixed with resin to prepare resin-nanocrystal paste, the paste may be deposited on a diode chip that emits light at a desired wavelength. The resulting chip may be dipped in a mold including a mold epoxy resin and cured in oven. Finally, the cured chip may be removed from the mold to obtain a fabricated device using the nanocrystals.

According to the example embodiments of the present invention, multi-shell nanocrystal structures may be more efficiently formed. The emission wavelength of a multi-shell nanocrystal structure may be shifted to a longer wavelength while simultaneously increasing the luminescence efficiency of the multi-shell nanocrystal structure. The multi-shell nanocrystal structure in accordance with example embodiments of the present invention may exhibit higher luminescence efficiency.

BRIEF DESCRIPTION OF THE DRAWINGS

Example embodiments of the present invention will be more clearly understood from the following detailed description taken in conjunction with the accompanying drawings.

FIGS. 1 and 2 are schematic diagrams illustrating methods for forming a nanocrystal structure according to example embodiments of the present invention;

FIGS. 3 thru 6 are schematic diagrams illustrating bandgaps of a nanocrystal structure according to example embodiments of the present invention;

FIG. 7 a graph showing the changes of the emission wavelength of nanocrystal prepared according to Example 1 as increasing Cd/Zn ratio of metal precursors;

FIG. 8 is a graph showing the changes of the emission wavelengths of the CdSe/CdS.ZnS nanocrystals prepared according to Example 2 as increasing the emission wavelength of the core nanocrystals;

FIG. 9 is luminescence spectra of CdSe core and CdSe/ZnSe.ZnS nanocrystals prepared according to Example 3;

FIG. 10 is a photograph comparing the luminescence efficiency of a nanocrystal structure prepared according to Example 1 of the present invention with the luminescence efficiency of a nanocrystal structure prepared according to Comparative Example 1;

FIG. 11 is a luminescence spectrum of diode fabricated according to Example 4 by using CdSe/ZnSe.ZnS nanocrystal prepared according to Example 1; and FIG. 12 is a photograph of the luminescent diode including CdSe/ZnSe.ZnS nanocrystal, fabricated according to Example 4.

DETAILED DESCRIPTION OF EXAMPLE EMBODIMENTS

Figure 1:
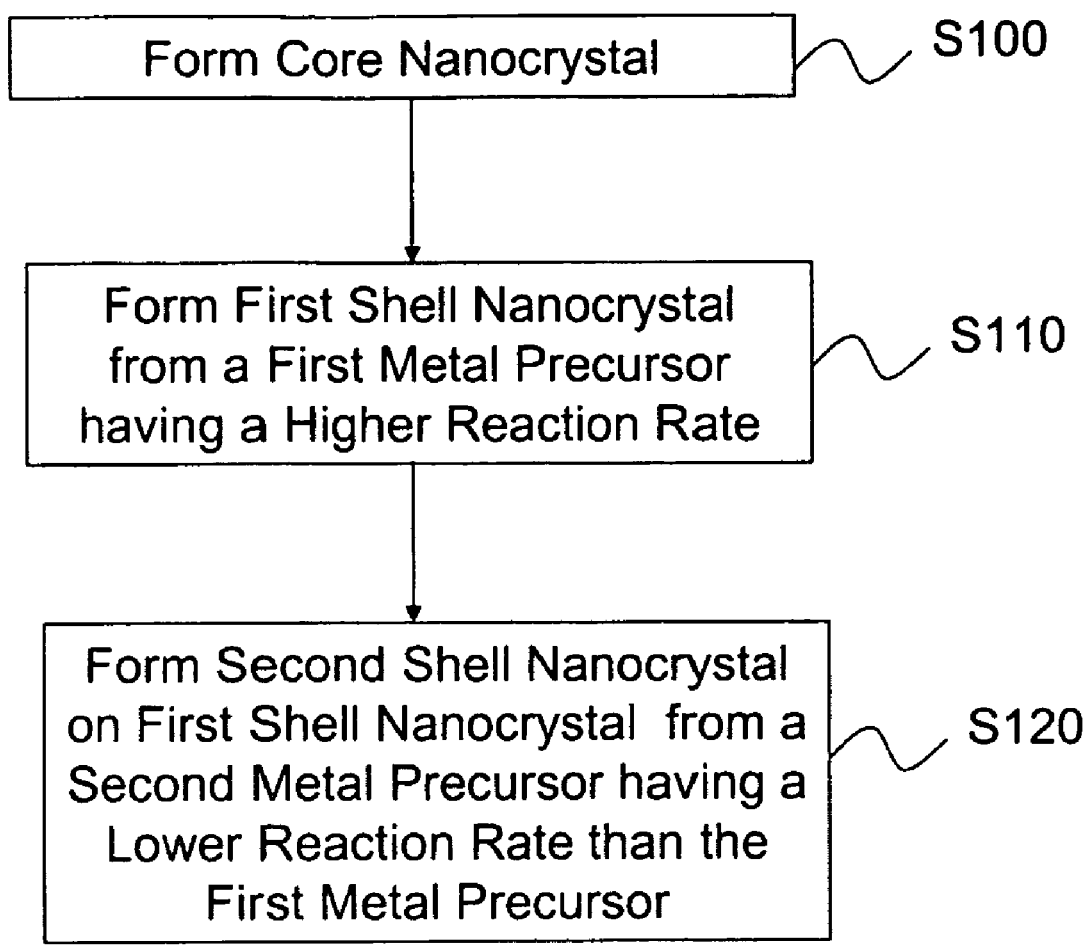
FIGS. 1-12 represent non-limiting, example embodiments of the present invention as described herewithin.

Various example embodiments of the present invention will now be described more fully with reference to the accompanying drawings in which some example embodiments of the invention are shown. In the drawings, the thicknesses of layers and regions may be exaggerated for clarity. Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments of the present invention.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Also, the use of the words "compound," "compounds," or "compound(s)," refer to either a single compound or to a plurality of compounds. These words are used to denote one or more compounds but may also just indicate a single compound.

Example embodiments of the present invention are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments of the invention should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of the present invention.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to the example embodiments described.

Example embodiments of the present invention relate to methods for forming a multi-shell nanocrystal structure, multi-shell nanocrystal structures and a device including the same. Other example embodiments of the present invention relate to methods for forming a multi-shell nanocrystal structure by preparing a core nanocrystal and simultaneously using at least two precursors having different reaction rates to sequentially form at least two shell layers of nanocrystals having different compositions on a surface of the core nanocrystal, multi-shell nanocrystal structures and a device including the same.

According to example embodiments of the present invention, multi-shell nanocrystal structures may be formed by forming a core nanocrystal, and simultaneously reacting two or more precursors having different reaction rates to sequentially form at least two shell layers of nanocrystals that may have different compositions on a surface of the core nanocrystal.

Figure 2:
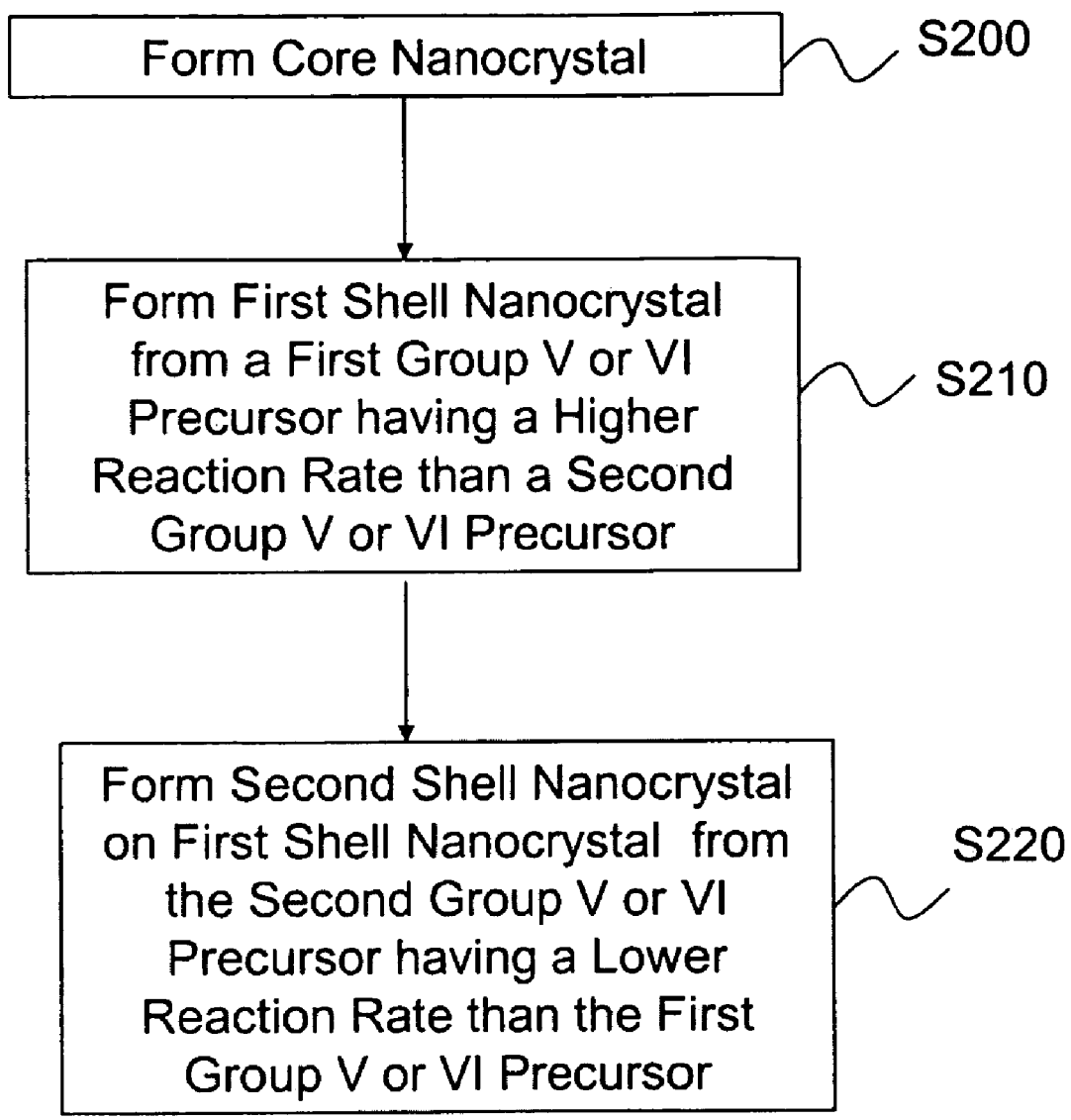

FIGS. 1 and 2 are schematic diagrams illustrating methods for forming a nanocrystal structure according to example embodiments of the present invention.

Referring to FIG. 1, a core nanocrystal may be prepared S100. A solution including core nanocrystals may be reacted with a mixture including a solvent, at least two metal precursors with different reaction rates and/or a Group V or VI precursor (e.g. a precursor having a Group V or VI element). A metal precursor, having a higher reaction rate than the other metal precursors, may be reacted with the Group V or VI precursor to form a first shell nanocrystal on the core nanocrystal S110. The other metal precursors may be reacted with the Group V or VI precursor in an order determined by a reaction rate of each metal precursor to sequentially form shell nanocrystals on the first shell nanocrystal (e.g., second, third, . . . (m)th, (m+1)th, . . . (n)th) S120.

Alternatively, referring to FIG. 2, a core nanocrystal may be prepared S200. A solution of the core nanocrystals may be simultaneously reacted with a mixture of a solvent, a metal precursor and/or at least two Group V or VI precursors with different reaction rates. The metal precursor may be reacted with a first Group V or VI precursor having a higher reaction rate than the other Group V or VI precursors to form a first shell nanocrystal on the core nanocrystal S210. The other Group V or VI precursors may be reacted with the metal precursor in an order determined by a reaction rate of each precursor to sequentially form shell nanocrystals on the first shell nanocrystal (e.g., second, third, . . . (m)th, (m+1)th, . . . (n)th) S220.

Because at least two of the metal precursors or at least two of the Group V or VI precursors have different reaction rates, at least two (e.g., first and second) shell nanocrystals may be sequentially formed on the core nanocrystal. Accordingly, a method for forming a multi-shell nanocrystal according to example embodiments of the present invention may be shortened, compared to the previous method (e.g., the need for performing separation techniques of the shell nanocrystals between shell coatings may be reduced).

In other example embodiments of the present invention, the first to (m)th shell nanocrystals may be selected from nanocrystal layers capable of shifting an emission wavelength to a longer wavelength. The (m+1)th to (n)th shell nanocrystals may be selected from nanocrystal layers capable of increasing luminescence efficiency. As a result, a multi-shell nanocrystal structure may be more efficiently formed. The emission wavelength of a multi-shell nanocrystal structure may be shifted to a longer wavelength while simultaneously increasing the luminescence efficiency of the multi-shell nanocrystal structure. The multi-shell nanocrystal structure in accordance with example embodiments of the present invention may exhibit higher luminescence efficiency.

According to yet other example embodiments of the present invention, the first to (n)th shell nanocrystals may be selected from nanocrystal layers capable of shifting the emission wavelength to a longer wavelength. The first to (n)th shell nanocrystals may be selected from nanocrystal layers capable of increasing the luminescence efficiency. In order to form the first to (n)th shell nanocrystals, at least one layer of shell nanocrystals for shifting the emission wavelength to a longer wavelength and at least one layer of shell nanocrystals for increasing the luminescence efficiency may be mixed, or alternately formed.

In an example embodiment of the present invention, a plurality of shell layers of nanocrystals may be formed on a core nanocrystal according to a difference in a crystal lattice constant between the shell layers of nanocrystals and the core nanocrystal. The plurality of shell layers of nanocrystals may be sequentially formed in order of a difference in the crystal lattice constant between the shell layers of nanocrystals and the core nanocrystal. The order of shell layers may be arranged such that a shell layer having a largest crystal lattice constant is formed nearest to the core nanocrystal and a shell layer having a smallest crystal lattice constant is formed furthest from the core nanocrystal. Because the difference in the crystal lattice constant between the layers of shell nanocrystals becomes smaller, the stability of a multi-shell nanocrystal structure may increase. As a result, a more stable multi-shell nanocrystal structure may be more efficiently formed.

According to example embodiments of the present invention, a core nanocrystal may be formed by adding each of a metal precursor and a Group V or VI precursor to a solvent. A product of the metal precursor-solvent mixture and a product of the Group V or VI precursor-solvent mixture may be reacted with each other to form a core nanocrystal.

A reaction may be carried out by simultaneously reacting at least two metal precursors having different reaction rates with a Group V or VI precursor in the presence of a solvent containing the core nanocrystal. Alternatively, a reaction may be carried out by simultaneously reacting a metal precursor with at least two Group V or VI precursors having different reaction rates in the presence of a solvent containing the core nanocrystal.

Examples of the metal precursors that may be used include, but are not limited to, dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, dimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, mercury acetate, mercury iodide, mercury bromide, mercury chloride, mercury fluoride, mercury cyanide, mercury nitrate, mercury oxide, mercury perchlorate, mercury sulfate, lead acetate, lead bromide, lead chloride, lead fluoride, lead oxide, lead perchlorate, lead nitrate, lead sulfate, lead carbonate, tin acetate, tin bisacetylacetonate, tin bromide, tin chloride, tin fluoride, tin oxide, tin sulfate, germanium tetrachloride, germanium oxide, germanium ethoxide, gallium acetylacetonate, gallium chloride, gallium fluoride, gallium oxide, gallium nitrate, gallium sulfate, indium chloride, indium oxide, indium nitrate, indium sulfate, thallium acetate, thallium acetylacetonate, thallium chloride, thallium oxide, thallium ethoxide, thallium nitrate, thallium sulfate, thallium carbonate and/or the like. The selection of two or more particular metal precursors having different reaction rates from the above-mentioned metal precursors may be routinely made by those skilled in the art.

Examples of Group V and VI precursors that may be used include, but are not limited to, alkyl thiol compounds and/or alkyl phosphines. Example alkyl thiol and alkyl phosphine compounds include, but are not limited to, hexane thiol, octane thiol, decane thiol, dodecane thiol, hexadecane thiol, mercaptopropyl silane, sulfur-trioctylphosphine (S—TOP), sulfur-tributylphosphine (S—TBP), sulfur-triphenylphosphine (S—TPP), sulfur-trioctylamine (S—TOA), trimethylsilyl sulfur, ammonium sulfide, sodium sulfide, selenium-trioctylphosphine (Se—TOP), selenium-tributylphosphine (Se—TBP), selenium-triphenylphosphine (Se-TPP), tellurium-trioctylphosphine (Te—TOP), tellurium-tributylphosphine (Te—TBP), tellurium-triphenylphosphine (Te—TPP), trimethylsilyl phosphine, triethylphosphine, tributylphosphine, trioctylphosphine, triphenylphosphine, tricyclohexylphosphine and/or the like. The selection of two or more Group V or VI precursors, having different reaction rates, from the above-mentioned Group V and VI precursors may be made by those skilled in the art.

In an attempt to reduce the occurrence of side effects (e.g., precipitation of metal particles and/or formation of particles due to reactions between the metals and the Group V or VI precursors), it may be desirous to control concentrations and/or feeding rates of the precursors depending on the reactivity of the precursors.

Examples of solvents that may be used include, but are not limited to, $C_{6-22}$ primary alkyl amines, $C_{6-22}$ secondary alkyl amines, and $C_{6-22}$ tertiary alkyl amines, $C_{6-22}$ primary alcohols, $C_{6-22}$ secondary alcohols, $C_{6-22}$ tertiary alcohols, $C_{6-22}$ ketones and esters, $C_{6-22}$ heterocyclic compounds containing nitrogen or sulfur, $C_{6-22}$ alkanes, $C_{6-22}$ alkenes, $C_{6-22}$ alkynes, trioctylamine, trioctylphosphine, trioctylphosphine oxide and/or any other suitable compound.

In other example embodiments of the present invention, the solvent may further include a surfactant. The surfactant may be acidic or a basic. Examples of the acidic surfactants include oleic acid, stearic acid, palmitic acid, hexyl phosphonic acid, n-octyl phosphonic acid, tetradecyl phosphonic acid, octadecyl phosphonic acid and/or the like. The basic surfactant may be an amine. Examples of amines that may be used, but are not limited to, include n-octyl amine, hexadecyl amine and/or the like.

In other example embodiments of the present invention, the surfactant may be a $C_{6-22}$ alkane having a terminal acid (OH) or amine ($NH_2$) functional group. The surfactant may be a $C_{6-22}$ alkene having a terminal acid (OH) or amine ($NH_2$) functional group.

Example of $C_{6-22}$ alkanes or alkenes having a terminal acid (OH) functional group that may be used include $C_{6-22}$ alkanes and alkenes having a terminal COOH group, $C_{6-22}$ alkanes and alkenes having a terminal POOH group, $C_{6-22}$ alkanes and alkenes having a terminal SOOH group, and/or the like.

To facilitate the crystal growth and/or ensure the stability of the solvents, the above-described method may be performed in a temperature range of about 100° C. to about 460° C. In other example embodiments of the present invention, the temperature range may be about 120° C. to about 420° C. or about 150° C. to about 360° C.

Because the reaction rates may be controlled, the above-described method may be carried out for about 5 seconds to about 4 hours. In other embodiments, the method may be carried out for about 10 seconds to about 3 hours, or about 20 seconds to about 2 hours.

Materials having different emission wavelengths may be formed by varying the ratio between the two or more metal precursors simultaneously added in the method according to the example embodiments of the present invention. Alternatively, despite the use of the two or more metal precursors in the same ratio, materials having different emission wavelengths may be formed by controlling the size of the core nanocrystal.

The metal precursors used in the method according to the example embodiments of the present invention may have a concentration of about 0.0001 M-2 M. Alternatively, the concentration of the metal precursors may be about 0.001 M-1.6 M.

The ratio of the Group VI or V precursors to the metal precursors used may be between approximately 100:1, or approximately 1:50. The ratio of the Group VI or V precursors to the metal precursors may be between approximately 50:1 and approximately 1:10.

A multi-shell nanocrystal structure according to example embodiments of the present invention will know be described.

The multi-shell nanocrystal structure may include a core nanocrystal and at least two layers of shell nanocrystals having different compositions formed on the surface of the core nanocrystal. The multi-shell nanocrystal structure may include a core nanocrystal and a plurality of shell nanocrystals (e.g., first, second, third, . . . (m)th, (m+1)th, . . . (n)th). The shell nanocrystals may have different compositions sequentially formed on a surface of the core nanocrystal.

The multi-shell nanocrystal structure may have a structure wherein at least one shell layer of nanocrystals may be formed on a surface of a core nanocrystal to shift the emission wavelength of the core nanocrystal to a longer wavelength, and at least one shell layer of nanocrystals may be formed thereon to increase the luminescence efficiency.

Figure 3:
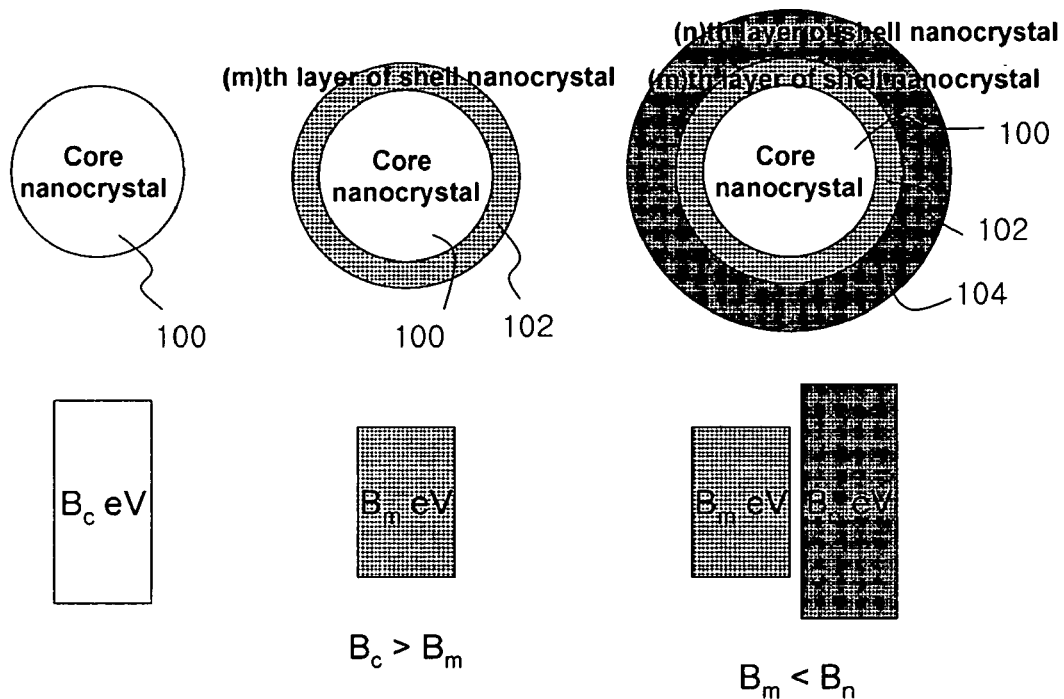

FIG. 3 is a schematic diagram illustrating bandgaps of a nanocrystal structure according to example embodiments of the present invention.

Referring to FIG. 3, an inner shell layer 102 of nanocrystals (e.g., a first shell nanocrystal m, wherein m=1) may be formed on a surface of a core nanocrystal 100. An outer shell layer 104 of nanocrystals (e.g., a second shell nanocrystal n, wherein n=2) may be formed on the inner shell nanocrystal 102. After coating, a bandgap $B_m$ of the inner shell layer 102 of nanocrystals may be smaller than a bandgap $B_c$ of the core nanocrystal 100.

In a type II nanocrystal structure, a conduction band energy level of a first shell nanocrystal (e.g., CdS nanocrystal) may be lower than a conduction band energy level of a core nanocrystal (e.g., CdSe nanocrystal), and a valence band energy level of the first shell nanocrystal may be lower than a valence band energy level of the core nanocrystal. If a multi-shell nanocrystal structure has the above-described type II nanocrystal structure, then holes of the core nanocrystal may be present in the valence band of the core nanocrystal, which has a more stable energy level, but excited electrons of the core nanocrystal may be transferred to the conduction band of the first shell nanocrystal. As a result, the bandgap difference may become smaller and the emission wavelength may be shifted to a longer wavelength.

Alternatively, in type II nanocrystal structure, a conduction band energy level of the first shell layer of nanocrystals (e.g., CdTe nanocrystal) may also be higher than a conduction band energy level of the core nanocrystal (e.g., CdSe nanocrystal), and a valence band energy level of the first shell layer of nanocrystals may be higher than a valence band energy level of the core nanocrystal. If a multi-shell nanocrystal structure has the above-described type II nanocrystal structure, then excited electrons of the core nanocrystal may be transferred to the conduction band of the first shell layer of nanocrystals, which has a more stable energy level, but holes of the core nanocrystal may be present in the valence band of the core nanocrystal. As a result, the bandgap difference may become smaller and the emission wavelength may be shifted to a longer wavelength.

If the conduction and valence bands of the core nanocrystal are identical to the conduction and valence bands of the first shell nanocrystal, electrons and holes may be present with a same probability from the core nanocrystal to the first shell layer of nanocrystals. As a result, the core nanocrystal may increase in size, and the emission wavelength may be shifted to a longer wavelength.

A multi-shell nanocrystal structure may have a structure wherein a conduction band energy level of the outer second shell layer of nanocrystals (n=2) (e.g., a ZnS nanocrystal) may be higher than the conduction band energy level of the inner first shell layer of nanocrystals (m=1) after coating, and the valence band energy level of the second shell layer of nanocrystals may have a lower bandgap than the valence band energy level of the first shell layer of nanocrystals after coating. As a result, the luminescence efficiency of the multi-shell nanocrystal structure may increase due to quantum confinement effects or passivation effects.

According to example embodiments of the present invention, n and m are positive real numbers, and n is greater than m.

In other example embodiments of the present invention, a multi-shell nanocrystal structure may have a structure wherein a plurality of shell layers of nanocrystals may be formed on the surface of a core nanocrystal to shift the emission wavelength of the core nanocrystal to a longer wavelength.

Figure 4:
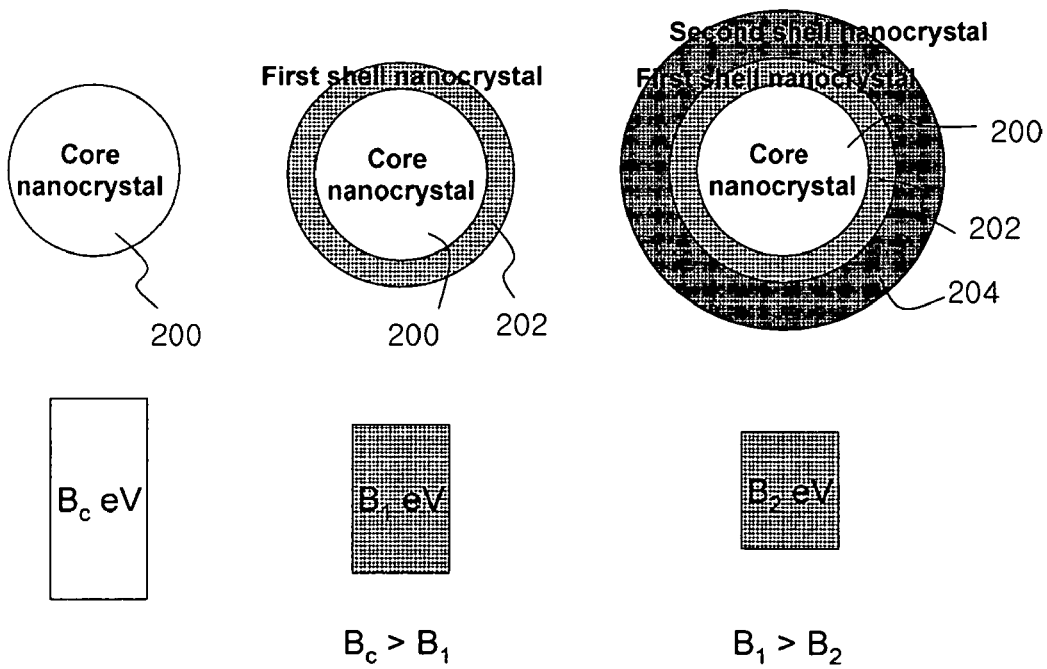

FIG. 4 is a schematic diagram illustrating bandgaps of the nanocrystal structure according to another example embodiment of the present invention.

Referring to FIG. 4 an inner shell layer 202 of nanocrystals (e.g. a first shell layer of nanocrystals) may be formed on the surface of a core nanocrystal 200 and an outer shell layer 204 of nanocrystals (e.g., a second shell layer of nanocrystals) may be formed on the first shell layer 202. As shown in FIG. 4, after coating a bandgap $B_1$ of the first shell nanocrystal 202 becomes smaller than a band gap $B_c$ of the core nanocrystal 200, and a bandgap $B_2$ of the second shell nanocrystal 204 becomes smaller than the bandgap $B_c$ of the core nanocrystal 200.

In other example embodiments of the present invention, the multi-shell nanocrystal structure may have a structure wherein a plurality of shell layers of nanocrystals may be formed on the surface of a core nanocrystal to increase the luminescence efficiency of the core nanocrystal.

Figure 5:
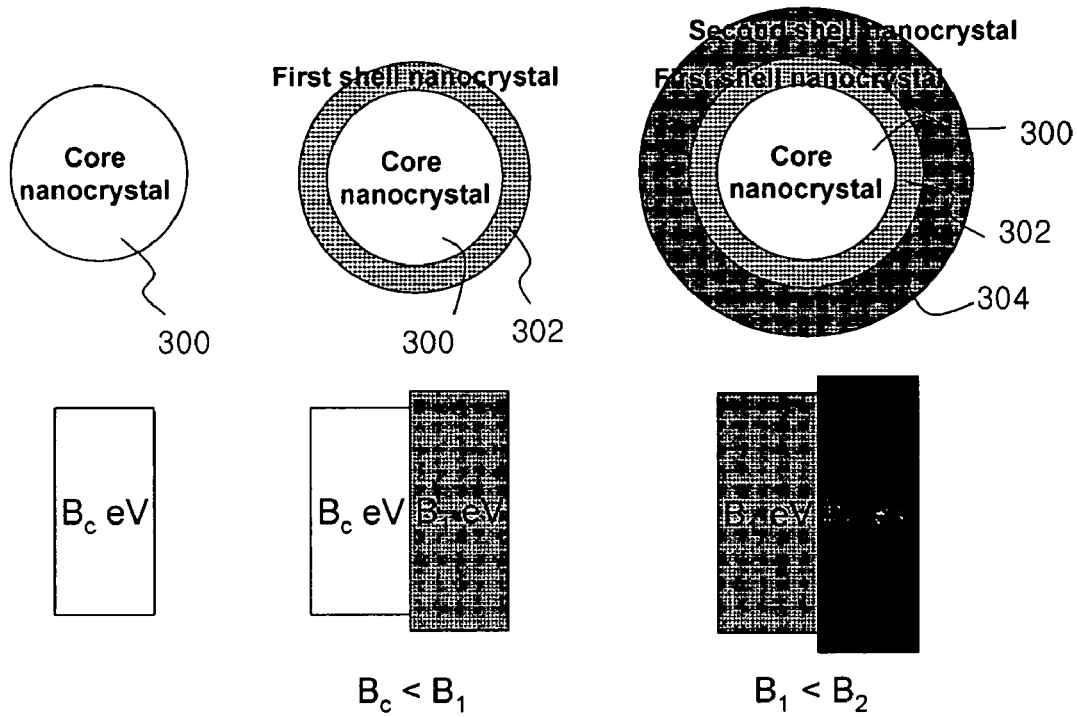

FIG. 5 is a schematic diagram illustrating the bandgaps of the nanocrystal structure according to example embodiments of the present invention.

Referring to FIG. 5, an inner shell layer 302 of nanocrystals (e.g. a first shell nanocrystal) may be formed on the surface of a core nanocrystal 300 and an outer shell layer 304 of nanocrystals (e.g., a second shell layer of nanocrystals) may be formed on the first shell layer 302.

As shown in FIG. 5, the conduction band energy level of the first shell layer 302 may be higher than the conduction band energy level of the core nanocrystal 300. The valence band energy level of the first shell layer 302 may have a smaller bandgap than the valence band energy level of the core nanocrystal 300. As a result, the luminescence efficiency may increase due to quantum confinement effects and/or passivation effects. After coating, the conduction band energy level of the second shell layer 304 may be higher than the conduction band energy level of the first shell layer 302, and the valence band energy level of the second shell layer 304 may have a smaller bandgap than the valence band energy level of the first shell nanocrystal 302. As a result, the luminescence efficiency may increase due to quantum confinement effects and/or passivation effects.

In other example embodiments of the present invention, the multi-shell nanocrystal structure may have a structure wherein at least one layer of shell nanocrystals, capable of shifting the emission wavelength of a core nanocrystal to a longer wavelength, and at least one layer of shell nanocrystals, capable of increasing the luminescence efficiency, may be mixed, or alternately, formed.

Figure 6:
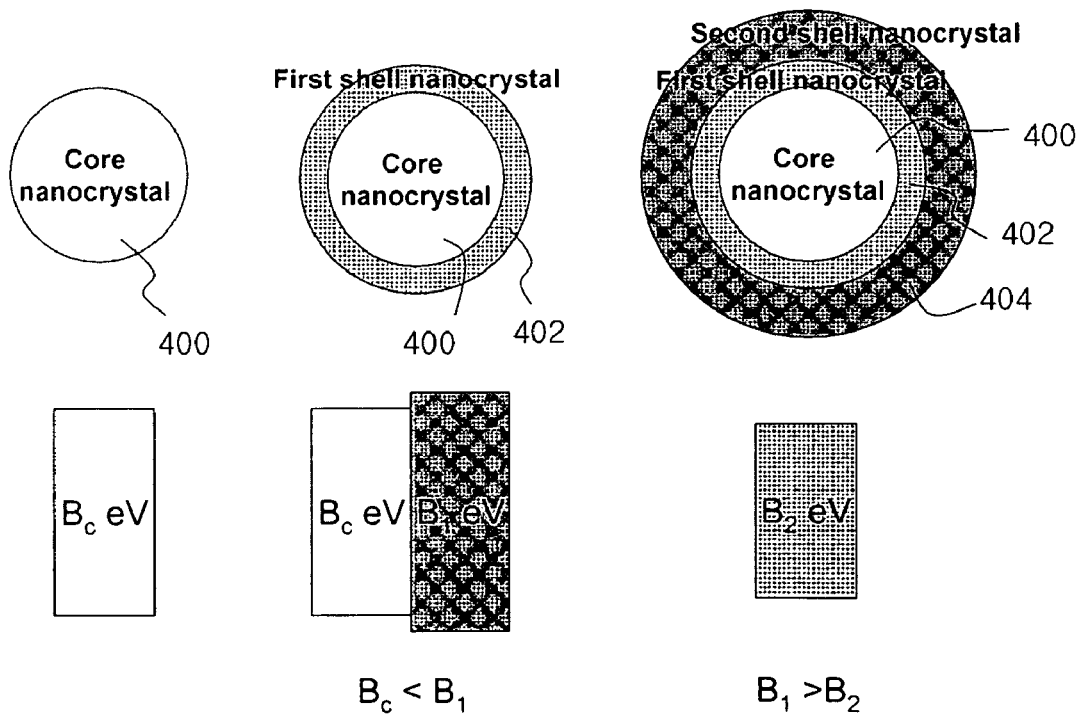

FIG. 6 is a schematic diagram illustrating the bandgaps of a nanocrystal structure according to example embodiments of the present invention.

Referring to FIG. 6, an inner shell layer 402 of nanocrystals (e.g. a first shell nanocrystal) may be formed on the surface of a core nanocrystal 400 to increase the luminescence efficiency, and an outer shell layer 404 of nanocrystals (e.g., a second shell nanocrystal) may be formed on the first shell layer 402 to shift the emission wavelength of the core nanocrystal to a longer wavelength.

As shown in FIG. 6, a conduction band energy level of the first shell layer 402 may be higher than a conduction band energy level of the core nanocrystal 400, and a valence band energy level of the first shell layer 402 may have a smaller bandgap than a valence band energy level of the core nanocrystal 400. As a result, the luminescence efficiency may increase due to quantum confinement effects and/or passivation effects. After coating, a bandgap of the second shell layer 404 may become smaller than a bandgap of the first shell layer 402. The nanocrystal structure may simultaneously emit light at the emission wavelength of the core nanocrystal 400 with increased luminescence efficiency, as well as, at a wavelength corresponding to the bandgap of the second shell layer 404.

In other example embodiments of the present invention, the multi-shell nanocrystal structure may have a structure wherein a plurality of shell layers of nanocrystals may be sequentially formed on a core nanocrystal in order of increasing difference in crystal lattice constant between shell layers of nanocrystals and a core nanocrystal. As such, the stability of the nanocrystal structure may be increased.

The multi-shell nanocrystal structure may be in the form of a sphere, a rod, a tripod, a tetrapod, a cube, a box or a star. The multi-shell nanocrystal structure is not limited to the shapes provided. Other shapes should be appreciated by persons skilled in the art.

The luminescence efficiency of the multi-shell nanocrystal structure may increase by about 20% or more. The luminescence efficiency of the multi-shell nanocrystal structure may increase by about 50%-90%.

Other example embodiments of the present invention are directed to a multi-shell nanocrystal structure including a core nanocrystal and a plurality of shell layers l of nanocrystals sequentially formed on a surface of the core nanocrystal. The plurality of shell layers l may include a plurality of inner shell layers $l_m$ of nanocrystals and a plurality of outer shell layers $l_{n-m}$ of nanocrystals.

The multi-shell nanocrystal structure may have a structure wherein, after coating, bandgaps of inner layers $l_m$ of shell nanocrystals may be smaller than a bandgap of the core nanocrystal, conduction band energy levels of outer shell layers $l_{n-m}$ of nanocrystals may be higher than conduction band energy levels of the inner shell layers $l_m$ of nanocrystals coated on the core nanocrystal and/or valence band energy levels of the outer shell layers $l_{n-m}$ of nanocrystals may be lower than the valence band energy levels of the inner shell layers $l_m$ of shell nanocrystals. Shell layers n and m are positive real numbers; and n is greater than m.

After coating, the bandgaps of the inners shell layers $l_m$ of nanocrystals may be smaller by about 0.1 eV or more than the bandgap of the core nanocrystal, the conduction band energy levels of the outer shell layers $l_{n-m}$ of nanocrystals may be higher by about 0.1 eV or more than the conduction band energy levels of the inner shell layers $l_m$ of nanocrystals coated on the core nanocrystal and/or the valence band energy levels of the outer shell layers $l_{n-m}$ of nanocrystals may be lower by about 0.1 eV or more than the valence band energy levels of the inner shell layers $l_m$ of nanocrystals. In the multi-shell nanocrystal structure, the first and (m)th layers of shell nanocrystals may shift the emission wavelength of the core nanocrystal to a longer wavelength and the (m+1)th to (n)th layers of shell nanocrystals increase the luminescence efficiency.

The multi-shell nanocrystal structure may have one of the following structures: i) a structure wherein a plurality of layers of shell nanocrystals may be formed on the surface of a core nanocrystal to shift the emission wavelength of the core nanocrystal to a longer wavelength; ii) a structure wherein a plurality of layers of shell nanocrystals may be formed on the surface of a core nanocrystal to increase the luminescence efficiency of the core nanocrystal; iii) a structure wherein a plurality of layers of shell nanocrystals for shifting the emission wavelength of a core nanocrystal to a longer wavelength and a plurality of layers of shell nanocrystals for increasing the luminescence efficiency are mixed, or alternately formed, on the surface of the core nanocrystal; and iv) a structure wherein a plurality of layers of shell nanocrystals may be sequentially formed on a core nanocrystal in order of increasing difference (e.g., larger to smaller) in crystal lattice constant between the layers of shell nanocrystals and the core nanocrystal. Due to the difference in the crystal lattice constant between the layers of shell nanocrystals becoming smaller, the stability of a multi-shell nanocrystal structure may increase.

Other example embodiments of the present invention are directed to an electronic device including a multi-shell nanocrystal structure. Examples of an electronic device including a multi-shell nanocrystal structure include luminescent diodes (LEDs), organic/inorganic hybrid electroluminescent devices, inorganic electroluminescent devices, photovoltaic cells, and transistors.

For example, the nanocrystal structure according to example embodiments of the present invention may be used to fabricate a luminescent diode in accordance with the following procedure. First, the nanocrystal structure may be mixed with a resin paste. The mixture may be deposited on a diode chip emitting UV light. The resulting chip may be cured in an oven at about 120° C. The cured chip may be dipped in a mold containing a molding epoxy resin for packaging in a lamp. The molded chip may be cured in an oven, and then removed. The mold may be removed from the cured chip to fabricate a lamp-shape luminescent diode in which the nanocrystal structure may be used as a luminous body.

Various example embodiments of the present invention will be explained in more detail with reference to the following examples. However, these examples are given for the purpose of illustration and should not be construed as limiting the scope of the invention.

Example 1

Formation of CdSe/CdS.ZnS Nanocrystals According to Changes in Ratio between Metal Precursors About 16 g of trioctylamine (TOA), about 2 g of oleic acid and about 1.6 mmol of cadmium oxide were simultaneously placed in a 125-ml flask equipped with a reflux condenser. The reaction temperature of the mixture was adjusted to about 300° C. with stirring.

Selenium (Se) powder was dissolved in trioctylphosphine (TOP) to obtain a Se—TOP complex solution with a Se concentration of about 0.2M. About 2 ml of the Se—TOP complex solution were added to the previous reaction mixture. The reaction continued to stir for about 30 seconds.

After completion of the reaction, the reaction mixture was cooled to about room temperature as rapidly as possible. Ethanol, a non-reactive solvent, was added to the reaction mixture, and then the resulting mixture was centrifuged. The precipitate obtained from centrifugation was separated from the supernatant, and dispersed in toluene to prepare a solution of CdSe nanocrystals that emits light at a wavelength of about 586 nm.

0.05 mmol, about 0.1 mmol and about 0.2 mmol of cadmium acetate were added to each solution of TOA (about 8 g), oleic acid (about 0.1 g) and zinc acetate (about 0.1 mmol). in a 125-ml flask equipped with a reflux condenser, respectively. While stirring, the reaction mixture was heated to about 300° C. After the CdSe nanocrystal solution was added to the reaction mixture, an S—TOP complex solution was slowly added thereto. The reaction was allowed to proceed for about one hour.

After the reaction was completed, the reaction mixture was cooled to about room temperature as rapidly as possible. Ethanol, a non-reactive solvent, was added to the reaction mixture, and the resulting mixtures was centrifuged. The precipitate obtained from centrifugation was separated from the supernatant, and dispersed in toluene to form CdSe/CdS.ZnS nanocrystals having a size of about 8 nm.

The nanocrystals exhibited emission of different colors as changing the ratio between the metal precursors used.

Figure 7:
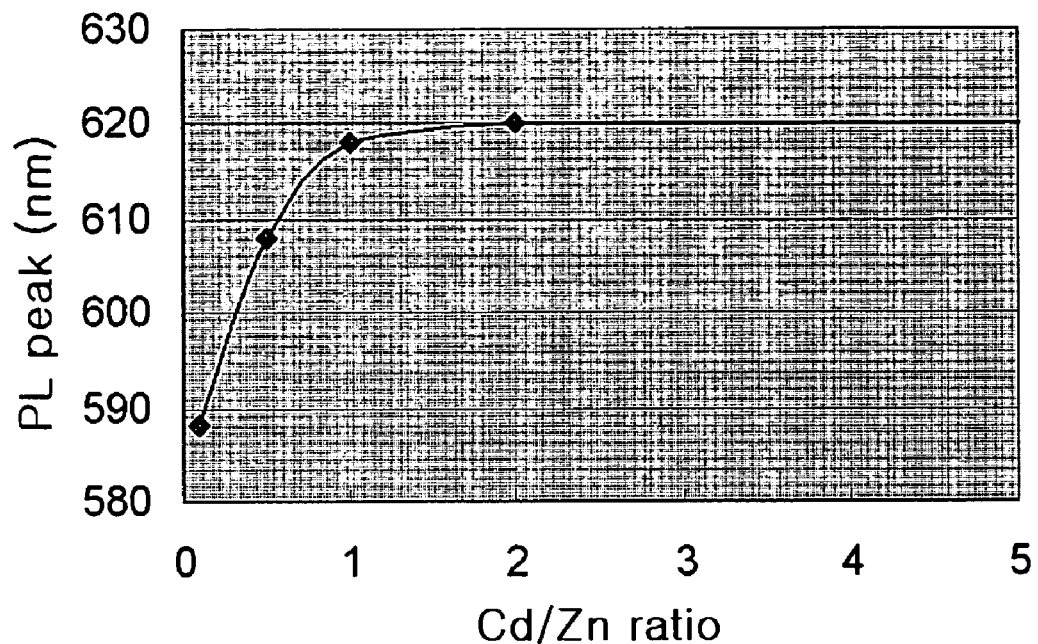

FIG. 7 a graph showing the changes of the emission wavelength of nanocrystal prepared according to Example 1 as increasing Cd/Zn ratio of metal precursors. As shown in FIG.

7, as the Cd/Zn ratio increases, the emission wavelength of the nanocrystals is increasingly shifted to red region.

Example 2

Formation of CdSe/CdS.ZnS Nanocrystals According to Changes in Size of CdSe Core Nanocrystal About 16 g of TOA, about 2 g of oleic acid and about 1.6 mmol of cadmium oxide were simultaneously placed in a 125-ml flask equipped with a reflux condenser. The reaction temperature of the mixture was adjusted to about 300° C. while continuing to stir. Separately, selenium (Se) powder was dissolved in trioctylphosphine (TOP) to obtain a Se—TOP complex solution with a Se concentration of about 0.2M. About 2 ml of the Se—TOP complex solution were added to the previous reaction mixture. The reaction was allowed to proceed for about 30 seconds to prepare a CdSe nanocrystal that emits light at a wavelength of about 586 nm.

About 16 g of TOA, about 0.3 g of octadecyl phosphonic acid and about 0.4 mmol of cadmium oxide were simultaneously placed in a 125-ml flask equipped with a reflux condenser. While stirring, the reaction temperature of the mixture was adjusted to about 300° C. Separately, a selenium (Se) powder was dissolved in trioctylphosphine (TOP) to obtain a Se—TOP complex solution with a Se concentration of about 1M. About 2 ml of the Se—TOP complex solution were added to the previous reaction mixture. The reaction was allowed to proceed for about 4 minutes to prepare a CdSe nanocrystal that emits light at a wavelength of about 536 nm.

About 16 g of TOA, about 0.3 g of octadecyl phosphonic acid and about 0.4 mmol of cadmium oxide were simultaneously placed in a 125-ml flask equipped with a reflux condenser. The reaction temperature of the mixture was adjusted to about 300° C. while continuing to stir. A selenium (Se) powder was dissolved in trioctylphosphine (TOP) to obtain a Se—TOP complex solution with a Se concentration of about 2M, and about 2 ml of the Se—TOP complex solution were added to the previous reaction mixture. The reaction was allowed to proceed for about 2 minutes to prepare a CdSe nanocrystal that emits light at a wavelength of about 494 nm.

After completion of the reactions, the reaction mixtures were cooled to about room temperature as rapidly as possible. Ethanol, a non-reactive solvent, was added to the reaction mixtures, and the resulting mixtures were centrifuged. The precipitate obtained from centrifugation were separated from the supernatants, and dispersed in toluene to prepare solutions of the CdSe nanocrystals that emit light at wavelengths of about 586 nm, about 536 nm, and about 494 nm, respectively.

About 8 g of TOA, about 0.1 g of oleic acid, about 0.1 mmol of zinc acetate and about 0.1 mmol of cadmium acetate were simultaneously placed in a 125-ml flask equipped with a reflux condenser. While stirring, the reaction temperature of the mixture was adjusted to about 300° C. The solutions of CdSe nanocrystals that emit light at wavelengths of about 586 nm, about 536 nm and about 494 nm, respectively, were added to the previous reaction mixture. An S—TOP complex solution was slowly added thereto. The reaction was allowed to proceed for about one hour.

After the reaction was completed, the reaction mixture was cooled to about room temperature as rapidly as possible. Ethanol, a non-reactive solvent, was added to the reaction mixture, and the resulting mixture was centrifuged. The precipitate obtained from centrifugation was separated from the supernatant, and dispersed in toluene to form CdSe/CdS.ZnS nanocrystals having a size of about 8 nm.

The nanocrystals emitted light of different colors depending on the emission wavelength of the core nanocrystals.

Figure 8:
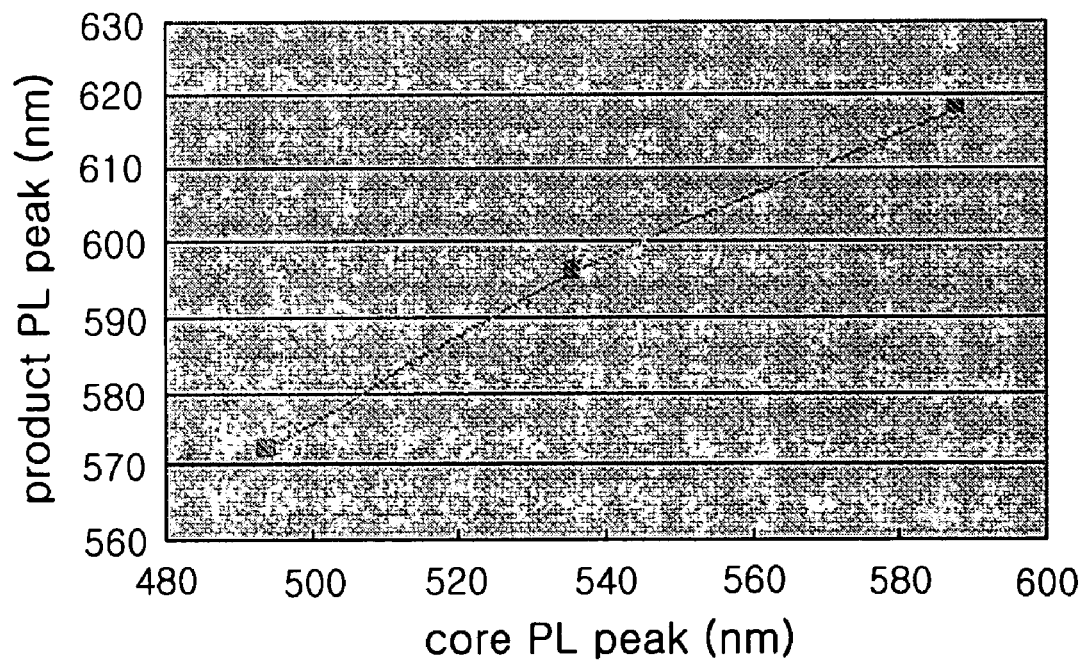

FIG. 8 is a graph showing the changes of the emission wavelengths of the CdSe/CdS.ZnS nanocrystals prepared according to Example 2 as increasing the emission wavelength of the core nanocrystals.

As shown in FIG. 8, as the emission wavelength of the core nanocrystals increases, the light emission of the nanocrystals is observed at longer wavelengths.

Example 3

Formation of CdSe/ZnSe.ZnS Nanocrystals 16 g of trioctylamine (TOA), about 0.3 g of octadecyl phophonic acid and about 0.4 mmol of cadmium oxide were simultaneously placed in a 125-ml flask equipped with a reflux condenser. The reaction temperature of the mixture was adjusted to about 300° C. while continuing to stir. A selenium (Se) powder was dissolved in trioctylphosphine (TOP) to obtain an Se—TOP complex solution with a Se concentration of about 2M. About 2 ml of the Se—TOP complex solution were added to the previous reaction mixture. The reaction was allowed to proceed for about 2 minutes to prepare a CdSe nanocrystal that emits light at a wavelength of about 486 nm.

After completion of the reaction, the reaction mixture was cooled to about room temperature as rapidly as possible. Ethanol, a non-reactive solvent, was added to the reaction mixture, and then the resulting mixture was centrifuged. The precipitate obtained from centrifugation was separated from the supernatant, and dispersed in toluene to prepare a solution of CdSe nanocrystals that emits light at a wavelength of about 486 nm.

About 8 g of TOA, about 0.1 g of oleic acid and about 0.1 mmol of zinc acetate were placed in a 125-ml flask equipped with a reflux condenser. The reaction temperature of the mixture was adjusted to about 300° C. while continuing to stir. The solution of the CdSe nanocrystal that emits light at a wavelength of about 486 nm was added to the reaction mixture, and thereafter, a mixed solution of a Se—TOP complex solution and an S—TOP complex solution was slowly added thereto. The reaction was allowed to proceed for about one hour.

After completion of the reaction, the reaction mixture was cooled to about room temperature as rapidly as possible. Ethanol, a non-reactive solvent, was added to the reaction mixture, and then the resulting mixture was centrifuged. The precipitate obtained from centrifugation was separated from the supernatant, and dispersed in toluene to prepare CdSe/ZnSe.ZnS nanocrystals having a size of about 5 nm.

Figure 9:
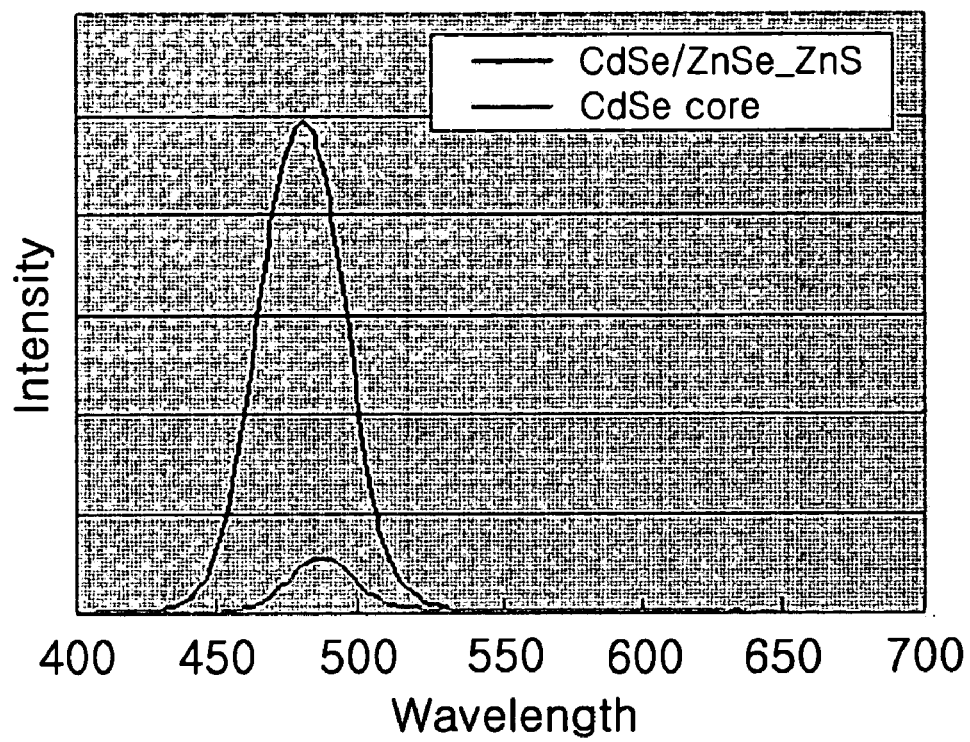

FIG. 9 is luminescence spectra of CdSe core and CdSe/ZnSe.ZnS nanocrystals prepared according to Example 3

As shown in FIG. 9, the nanocrystals demonstrated increased emission intensity while maintaining the emission wavelength of the core nanocrystal.

Comparative Example 1

Formation of CdSe/CdS/ZnS Nanocrystals by Separately Forming CdS on CdSe Core Nanocrystal and Forming ZnS on the CdSe/CdS Nanocrystal The procedure of Example 1 was repeated with the omission of the zinc precursor at first step. Particularly, the CdSe core nanocrystal prepared in Example 1 was mixed with a solution containing about 8 g of TOA, about 0.1 g of oleic acid and about 0.1 mmol of Cd acetate, and then S—TOP was slowly injected thereto to form a CdS shell nanocrystal (e.g., a first shell nanocrystal) on the core nanocrystal. The procedure of Example 1 was repeated with the omission of the cadmium precursor by using CdSe/CdS nanocrystal thus obtained as a core. Particularly, the core and S—TOP were slowly fed to a solution containing about 8 g of TOA, about 0.1 g of oleic acid and about 0.1 mmol of cadmium acetate to form a ZnS shell nanocrystal (e.g., a second shell nanocrystal).

Figure 10:
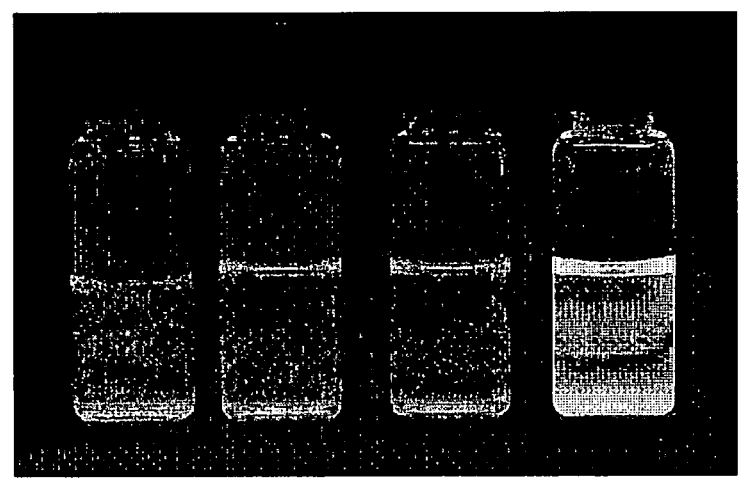

FIG. 10 is a photograph of a nanocrystal solution prepared according to Example 1, a nanocrystal solution prepared according to Comparative Example 1, and the CdSe core nanocrystal solution, taken under a UV lamp of about 365 nm.

As shown in FIG. 10, the nanocrystals prepared according to Comparative Example 1 exhibited same emission with the nanocrystals prepared according to Example, but showed decreased luminescence efficiency.

Example 4

Fabrication of Luminescent Diode

To obtain a resin-nanocrystal paste, about 2 g of a resin mixture preparing with an epoxy resin and a curing agent in a weight ratio of about 1:1, were mixed well with the CdSe/CdS.ZnS nanocrystals prepared according to Example 1, which were formed using a mixture of about 0.1 mmol cadmium acetate and about 0.11 mmol zinc acetate. The paste was deposited on a diode chip that emits UV light at a wavelength about 400 nm. The resulting chip was cured in an oven at about 120° C. for about 1 hour. The cured chip was dipped in a mold containing a resin mixture of an epoxy resin and a curing agent in a weight ratio of about 1:1 and cured in an oven at about 120° C. for 2 hours. Finally, the cured chip may be removed from the mold to obtain a fabricated device using the CdSe/CdS.ZnS nanocrystals. When a current of about 20 mA was applied to the diode, the diode emitted red light at a wavelength of about 618 nm. The diode was placed in an integrating sphere to measure luminescence efficiency of the diode. As a result, the luminescence efficiency of the diode was about 20%.

Figure 11:
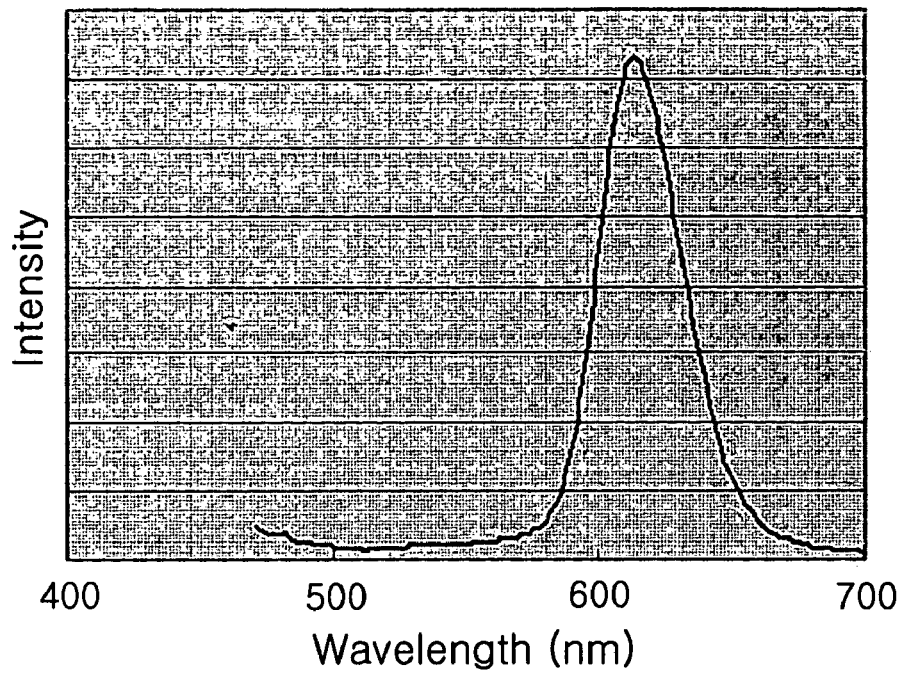
Figure 12:
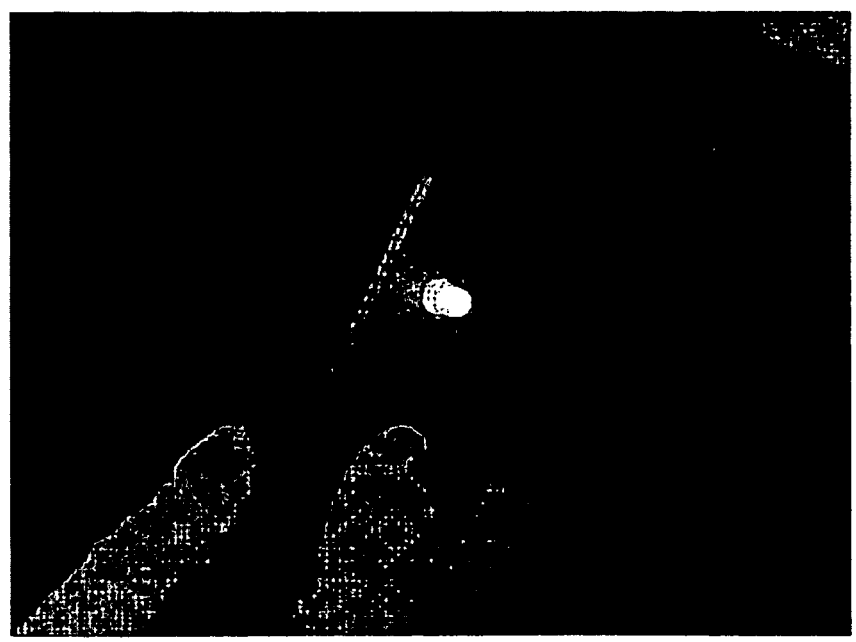

FIG. 11 is a luminescence spectrum of diode fabricated according to Example 4 by using CdSe/ZnSe.ZnS nanocrystal prepared according to Example 1; and FIG. 12 is a photograph of the luminescent diode including CdSe/ZnSe.ZnS nanocrystal, fabricated according to Example 4.

As shown in FIG. 11, the luminescent diode emits light at the same wavelength of CdSe/CdS.ZnS nanocrystals prepared according to Example 1 and used in the fabrication of the diode.

As apparent from the foregoing example embodiments of the present invention, multi-shell nanocrystal structures may be formed wherein the emission wavelength may shift to a longer wavelength and/or the luminescence efficiency may increase. Also, the stability of the multi-shell nanocrystal structures may be enhanced due to a decreased difference in lattice constant.

Other example embodiments of the present invention provide methods of forming a multi-shell nanocrystal structure. Because precursors having different reaction rates may be simultaneously fed to form the nanocrystal structure, the methods may be shortened (e.g., the need for separation may be reduced). Properties of the multi-shell nanocrystal structures may be improved, such as luminescence, compared to nanocrystal structures formed by separately feeding metal precursors.

Although example embodiments of the present invention have been particularly shown and described with reference to the example embodiments shown in the drawings, those skilled in the art will appreciate that various modifications, additions and substitutions may be possible, without departing from the scope and spirit of the present invention as disclosed in the accompanying claims.

What is claimed is:

1. A method for forming a multi-shell nanocrystal structure, comprising:
   (a) forming a core nanocrystal; and
   (b) simultaneously reacting at least two precursors having different reaction rates to sequentially form at least two shell layers of nanocrystals having different compositions on a surface of the core nanocrystal.

2. The method according to claim 1, wherein step (b) includes adding a metal precursor to a solvent to form a first mixture, and adding a Group V or VI precursor to the solvent to form a second mixture, and mixing the first mixture and the second mixture to react with each other.

3. The method according to claim 1, wherein step (b) includes simultaneously reacting at least two metal precursors having different reaction rates and a Group V or VI precursor in the presence of a solvent containing the core nanocrystal.

4. The method according to claim 1, wherein step (b) includes simultaneously reacting a metal precursor and at least two Group V or VI precursors having different reaction rates in the presence of a solvent containing the core nanocrystal.

5. The method according to claim 2, wherein the metal precursor includes zinc, cadmium, mercury, lead, tin, germanium, gallium, indium or thallium.

6. The method according to claim 5, wherein the metal precursor is selected from the group including dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, dimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, mercury acetate, mercury iodide, mercury bromide, mercury chloride, mercury fluoride, mercury cyanide, mercury nitrate, mercury oxide, mercury perchlorate, mercury sulfate, lead acetate, lead bromide, lead chloride, lead fluoride, lead oxide, lead perchlorate, lead nitrate, lead sulfate, lead carbonate, tin acetate, tin bisacetylacetonate, tin bromide, tin chloride, tin fluoride, tin oxide, tin sulfate, germanium tetrachloride, germanium oxide, germanium ethoxide, gallium acetylacetonate, gallium chloride, gallium fluoride, gallium oxide, gallium nitrate, gallium sulfate, indium chloride, indium oxide, indium nitrate, indium sulfate, thallium acetate, thallium acetylacetonate, thallium chloride, thallium oxide, thallium ethoxide, thallium nitrate, thallium sulfate and thallium carbonate.

7. The method according to claim 2, wherein the Group V or VI precursor is selected from the group including alkyl thiol compounds, including hexane thiol, octane thiol, decane thiol, dodecane thiol, hexadecane thiol and mercaptopropyl silane; and
   alkyl phosphines, including sulfur-trioctylphosphine (S-TOP), sulfur-tributylphosphine (S-TBP), sulfur-triphenylphosphine (S-TPP), sulfur-trioctylamine (S-TOA), trimethylsilyl sulfur, ammonium sulfide, sodium sulfide, selenium-trioctylphosphine (Se-TOP), selenium-tributylphosphine (Se-TBP), selenium-triphenylphosphine (Se-TPP), tellurium-trioctylphosphine (Te-TOP), tellurium-tributylphosphine (Te-TBP), tellurium-triphenylphosphine (Te-TPP), trimethylsilyl phosphine, triethylphosphine, tributylphosphine, trioctylphosphine, triphenylphosphine and tricyclohexylphosphine.

8. The method according to claim 2, wherein the solvent is selected from the group including $C_{6-22}$ primary alkyl amines, $C_{6-22}$ secondary alkyl amines, and $C_{6-22}$ tertiary alkyl amines, $C_{6-22}$ primary alcohols, $C_{6-22}$ secondary alcohols, $C_{6-22}$ tertiary alcohols, $C_{6-22}$ ketones and esters, $C_{6-22}$ heterocyclic compounds containing nitrogen or sulfur, $C_{6-22}$ alkanes, $C_{6-22}$ alkenes, $C_{6-22}$ alkynes, trioctylamine, trioctylphosphine and trioctylphosphine oxide.

9. The method according to claim 2, wherein the solvent includes a dispersant.

10. The method according to claim 9, wherein the dispersant is a $C_{6-22}$ alkane or alkene having a terminal acid (OH) functional group or a terminal amine ($NH_2$) functional group.

11. The method according to claim 10, wherein the terminal acid functional group is selected from the group including a carboxyl acid (COOH), a phosphonic acid (POOH) and a sulfonic acid (SOOH).

12. The method according to claim 9, wherein the dispersant is an acid or a base.

13. The method according to claim 12, wherein the acid is selected from the group including oleic acid, stearic acid, palmitic acid, hexyl phosphonic acid, n-octyl phosphonic acid, tetradecyl phosphonic acid and octadecyl phosphonic acid; and the base is selected from the group including n-octyl amine and hexadecyl amine.

14. The method according to claim 1, wherein each of steps (a) and (b) is performed at a temperature range of about 100° C. to about 460° C.

15. The method according to claim 1, wherein a process time of each of steps (a) and (b) is about 5 seconds to about 4 hours.

16. The method according to claim 3, wherein the at least two metal precursors have a concentration of about 0.0001 M to about 2 M.

17. The method according to claim 3, wherein a ratio of the Group VI or V precursor to the at least two metal precursors is between about 100:1 or about 1:50.

18. A multi-shell nanocrystal structure formed by the method according to claim 1, wherein the at least two shell layers include a plurality of shell layers of nanocrystals, the plurality of shell layers of nanocrystals includes a plurality of inner shell layers $l_m$ and a plurality of outer shell layers $l_{n-m}$, wherein n and m are positive real numbers and n is greater than m, bandgaps of the plurality of inner shell layers lm are smaller than a bandgap of the core nanocrystal after coating, conduction band energy levels of the plurality of outer shell layers $l_{n-m}$ are higher than conduction band energy levels of the plurality of inner shell layers $l_m$ coated on the core nanocrystal, and valence band energy levels of the plurality of outer shell layers $l_{n-m}$ are lower than valence band energy levels of the plurality of inner shell layers $l_m$.

19. The multi-shell nanocrystal structure according to claim 18, wherein at least one of the at least two shell layers is formed on the surface of the core nanocrystal to shift an emission wavelength of the core nanocrystal to a longer wavelength, and another of the at least two shell layers is formed thereon to increase luminescence efficiency.

20. The multi-shell nanocrystal structure according to claim 18, wherein the plurality of shell layers of nanocrystals shift an emission wavelength of the core nanocrystal to a longer wavelength.

21. The multi-shell nanocrystal structure according to claim 18, wherein the plurality of shell layers of nanocrystals increase luminescence efficiency of the core nanocrystal.

22. The multi-shell nanocrystal structure according to claim 19, wherein the at least one of the at least two shell layers for shifting the emission wavelength of the core nanocrystal to a longer wavelength and the other of the at least two shell layers for increasing the luminescence efficiency are mixed or alternately formed.

23. The multi-shell nanocrystal structure according to claim 18, wherein the plurality of shell layers of nanocrystals are formed in order of a difference in a crystal lattice constant between the plurality of shell layers of nanocrystals and the core nanocrystal, wherein a shell layer of nanocrystals having a largest crystal lattice constant is formed nearest to the core nanocrystal and a shell layer having a smallest crystal lattice constant is formed furthest from the core nanocrystal.

24. The multi-shell nanocrystal structure according to claim 18, wherein the multi-shell nanocrystal structure has a shape selected from the group including spheres, rods, tripods, tetrapods, cubes, boxes and stars.

25. The multi-shell nanocrystal structure according to claim 18, wherein after coating the bandgaps of the plurality of inner shell layers $l_m$ are smaller by about 0.1 eV or more than the bandgap of the core nanocrystal, the conduction band energy levels of the plurality of outer shell layers $l_{n-m}$ are higher by about 0.1 eV or more than the conduction band energy levels of the plurality of inner shell layers $l_m$ coated on the core nanocrystal, and the valence band energy levels of the plurality of outer shell layers $l_{n-m}$ are lower by about 0.1 eV or more than the valence band energy levels of the plurality of inner shell layers $l_m$.

26. A device comprising the multi-shell nanocrystal structure according to claim 18.

27. The device according to claim 26, wherein the device is a luminescent diode, an organic/inorganic hybrid electroluminescent device, an inorganic electroluminescent device, a photovoltaic cell or a transistor.

* * * * *